United States Patent
Kansy

(10) Patent No.: US 7,313,377 B2
(45) Date of Patent: Dec. 25, 2007

(54) SYSTEM, METHOD, AND CIRCUIT FOR DYNAMIC RANGE ENHANCEMENT IN A COMMUNICATION SYSTEM

(75) Inventor: Robert J. Kansy, Dallas, TX (US)

(73) Assignee: RF Monolithics, Inc., Dallas, TX (US)

(*) Notice: Subject to any disclaimer, the term of this patent is extended or adjusted under 35 U.S.C. 154(b) by 182 days.

(21) Appl. No.: 10/824,843

(22) Filed: Apr. 15, 2004

(65) Prior Publication Data

US 2004/0209586 A1   Oct. 21, 2004

Related U.S. Application Data

(60) Provisional application No. 60/463,022, filed on Apr. 15, 2003.

(51) Int. Cl.
*H04B 7/00* (2006.01)
(52) U.S. Cl. .................. 455/250.1; 455/280; 455/341; 375/345
(58) Field of Classification Search ......... 455/343.2–6, 455/574, 232.1, 234.1, 250.1, 255–260, 241.1, 455/343.1–343.6, 338–341; 375/345
See application file for complete search history.

(56) References Cited

U.S. PATENT DOCUMENTS

| | | | |
|---|---|---|---|
| 5,036,527 A * | 7/1991 | Halim et al. ................. | 375/345 |
| 5,339,454 A | 8/1994 | Kuo et al. | |
| 5,507,023 A * | 4/1996 | Suganuma et al. ....... | 455/234.1 |
| 5,734,974 A * | 3/1998 | Callaway et al. ......... | 455/234.1 |
| 6,026,288 A * | 2/2000 | Bronner .................... | 455/343.2 |
| 6,226,504 B1 * | 5/2001 | Takagi ...................... | 455/234.1 |
| 6,249,686 B1 * | 6/2001 | Dvorkin et al. .......... | 455/552.1 |
| 6,324,387 B1 * | 11/2001 | Kamgar et al. .......... | 455/234.1 |
| 6,363,127 B1 * | 3/2002 | Heinonen et al. ........... | 375/345 |
| 6,804,501 B1 * | 10/2004 | Bradley et al. ............. | 455/138 |
| 6,822,696 B2 * | 11/2004 | Talmola et al. ............. | 348/726 |
| 6,885,852 B2 * | 4/2005 | Hughes et al. ........... | 455/234.1 |
| 6,937,675 B2 * | 8/2005 | Seo ............................ | 375/346 |
| 6,961,552 B2 * | 11/2005 | Darabi et al. ............. | 455/241.1 |
| 6,994,427 B2 * | 2/2006 | Oishi .......................... | 347/68 |
| 2003/0207675 A1 * | 11/2003 | Hughes et al. ........... | 455/234.1 |

FOREIGN PATENT DOCUMENTS

| | | |
|---|---|---|
| EP | 0 366 485 A2 | 5/1990 |
| WO | WO 99/30426 A1 | 6/1999 |
| WO | WO 00/18023 A1 | 3/2000 |

* cited by examiner

*Primary Examiner*—Edward F. Urban
*Assistant Examiner*—Nhan T. Le

(57) ABSTRACT

A circuit includes one or more first amplifiers operable to amplify an incoming signal to produce an amplified incoming signal. The incoming signal is associated with a desired signal. The circuit also includes a controller. In response to the amplified incoming signal exceeding a first threshold and the desired signal not exceeding a second threshold, the controller is operable to allow one or more second amplifiers to amplify the incoming signal and/or increase a current supplied to the one or more first amplifiers.

26 Claims, 6 Drawing Sheets

SYSTEM, METHOD, AND CIRCUIT FOR DYNAMIC RANGE ENHANCEMENT IN A COMMUNICATION SYSTEM

RELATED APPLICATIONS

This application claims priority under 35 U.S.C. 119(e) to U.S. Provisional Application No. 60/463,022 filed on Apr. 15, 2003.

TECHNICAL FIELD

This disclosure is generally directed to communication systems and more specifically to a system, method, and circuit for dynamic range enhancement in a communication system.

BACKGROUND

Conventional communication systems often include communication devices that use receivers to amplify and process incoming signals. These communication devices often represent wireless devices that can be moved and used in different environments. Amplifiers in the communication devices often suffer from saturation when used in environments where strong signal strengths are encountered. These environments may include, for example, areas near a base station or other transmission source.

Conventional communication devices typically reduce saturation by using amplifiers that consume more power. However, the communication devices often receive their operating power from batteries, which typically supply power only for a limited amount of time. As a result, using amplifiers that consume more power shortens the useful life of the battery.

SUMMARY

This disclosure provides a system, method, and circuit for dynamic range enhancement in a communication system.

In one aspect, a circuit includes one or more first amplifiers operable to amplify an incoming signal to produce an amplified incoming signal. The incoming signal is associated with a desired signal. The circuit also includes a controller. In response to the amplified incoming signal exceeding a first threshold and the desired signal not exceeding a second threshold, the controller is operable to allow one or more second amplifiers to amplify the incoming signal and/or increase a current supplied to the one or more first amplifiers.

In a particular aspect, a switch couples a power supply to at least one of the one or more first amplifiers and the one or more second amplifiers. The controller is operable to open and close the switch.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
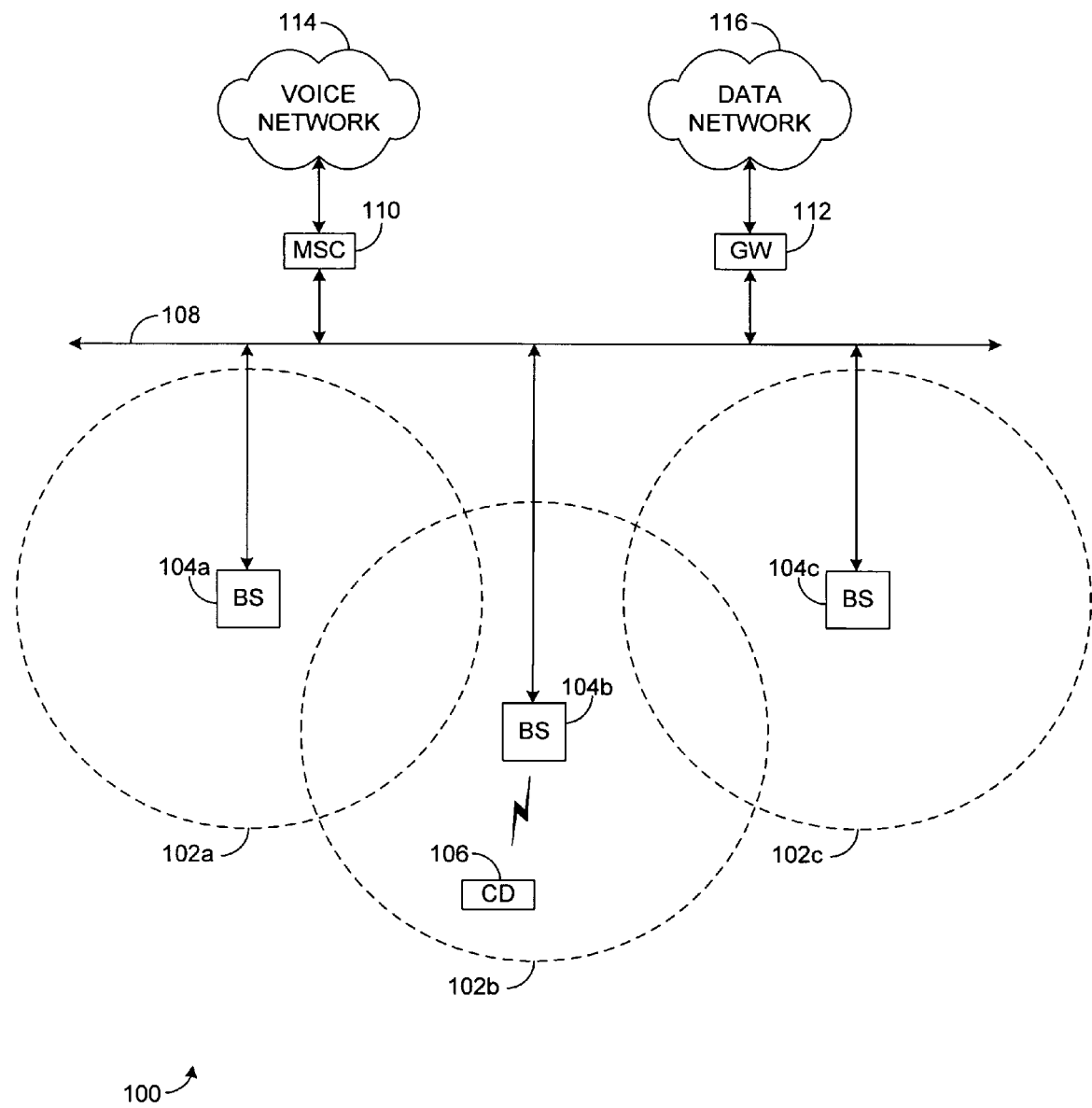
FIG. 1 illustrates an example communication system according to one embodiment of this disclosure.

FIG. 1 illustrates an example communication system 100 according to one embodiment of this disclosure. The communication system 100 illustrated in FIG. 1 is for illustration only. Other communication systems could be used without departing from the scope of this disclosure.

In the illustrated example, the communication system 100 includes multiple cell sites 102a-102c serviced by base stations (BS) 104a-104c and at least one communication device (CD) 106. Conventional communication devices include amplifiers that may suffer from saturation when used in environments where strong signal strengths are encountered. To reduce saturation, the conventional communication devices use amplifiers that consume more power, which often shortens the useful life of a battery or other power supply used in the communication devices.

The cell sites 102a-102c represent various areas where one or more communication devices 106 may receive wireless service. For example, the cell sites 102a-102c may represent areas where communication devices 106 may receive wireless voice and data services. While shown as circular areas in FIG. 1, the cell sites 102a-102c may have any suitable shape. Also, the cell sites 102a-102c may have any suitable arrangement and may or may not overlap.

The base stations 104a-104c communicate with the one or more communication devices 106 over wireless connections. For example, the base stations 104a-104c may communicate and receive wireless signals containing voice, data, and/or control signals to and from the communication devices 106. Each of the base stations 104a-104c includes any hardware, software, firmware, or combination thereof for communicating with communication devices 106. In this example, the base stations 104a-104c reside at the center of the cell sites 102a-102c, although the base stations 104a-104c could reside at any position(s) within the cell sites 102a-102c.

Figure 2:
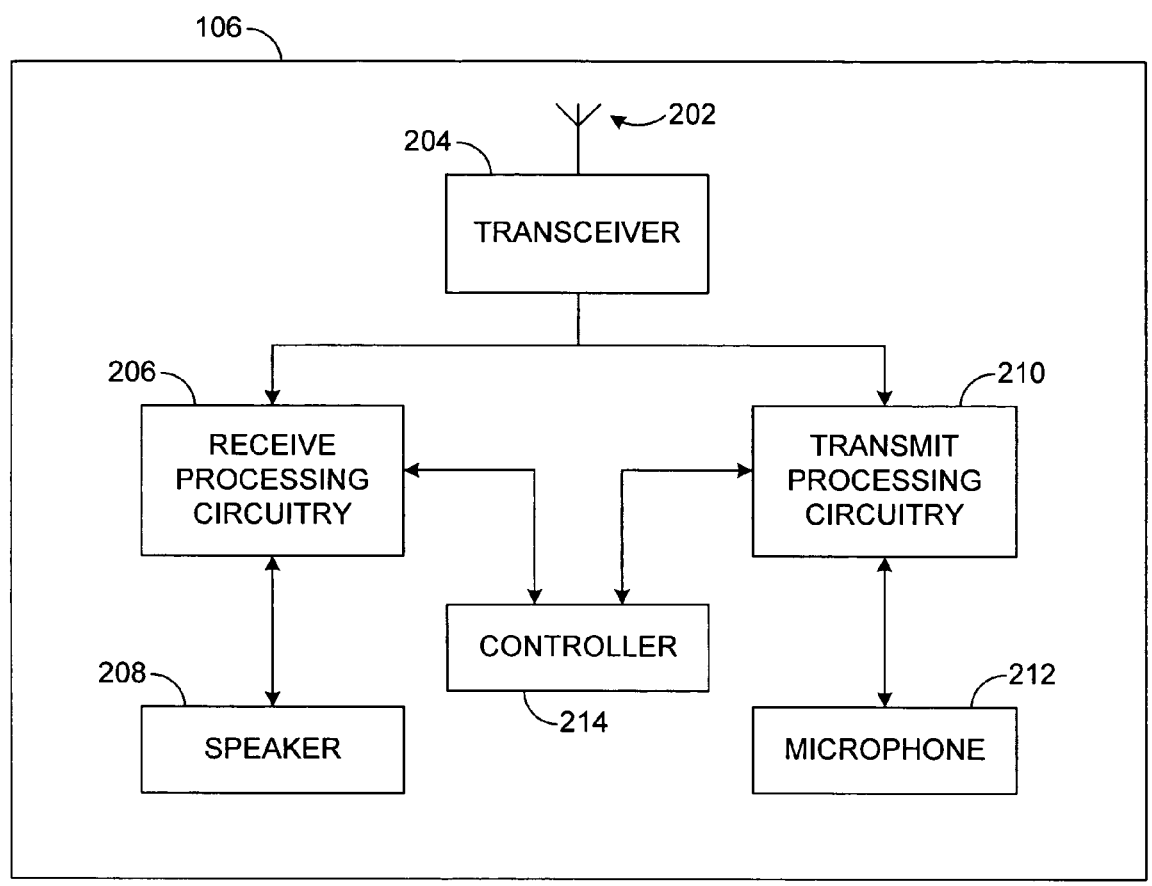
FIG. 2 illustrates an example communication device according to one embodiment of this disclosure.

Each communication device 106 represents any suitable device. For example, the communication device 106 could represent a mobile telephone, a computing device coupled to a wireless modem, a wireless personal digital assistant, or other device. Other or additional types of fixed or mobile devices could also be used in the communication system 100. The communication device 106 includes any hardware, software, firmware, or combination thereof for receiving wireless signals. An example embodiment of a communication device 106 is shown in FIG. 2, which is described below.

To facilitate providing wireless services to the communication devices 106, the base stations 104a-104c are coupled to one another by a bus 108. The base stations 104a-104c are also coupled to a mobile switching center (MSC) 110 and a data network gateway (GW) 112. The bus 108 allows voice, data, and control information to be transferred between base stations 104a-104c. The bus 108 also allows voice, data, and control information to be transferred between the MSC 110 or gateway 112 and the base stations 104a-104c. The bus 108 represents any suitable transport medium for transporting information between various components coupled to the bus 108.

The MSC 110 provides an interface to a voice network 114, such as a public switched telephone network (PSTN) or a public land mobile network (PLMN). The gateway 112 provides an interface to a data network 116, such as the Internet, a local area network (LAN), or a wide area network (WAN).

In one aspect of operation, the communication device 106 uses a first amplifier to amplify an incoming signal from the base stations 104a-104c. The incoming signal contains or is otherwise associated with a desired signal. The communication device 106 detects when the first amplifier becomes saturated, such as by determining whether the signal strength of the first amplifier's output exceeds a threshold. The communication device 106 also detects when the signal strength of the desired signal fails to exceed a threshold.

In some embodiments, when both of these events occur, the communication device 106 dynamically begins using at least one additional amplifier to amplify the incoming signals. In particular embodiments, the additional amplifier uses more operating power than the first amplifier. In other embodiments, when both events occur, the communication device 106 dynamically increases the current supplied to the first amplifier. In still other embodiments, the communication device 106 dynamically begins using at least one additional amplifier and increases the current supplied to the first amplifier.

By using the additional amplifier and/or increasing the current supplied to the first amplifier, the communication device 106 may more effectively amplify the incoming signals. For example, the communication device 106 may more effectively amplify the incoming signals even in areas where signal strengths are high. Also, the additional amplifier(s) and/or higher current for the first amplifier may be used in limited circumstances, which helps to reduce the power consumed by the communication device 106. This may help to lengthen the life of the power supply used in the communication device 106.

Although FIG. 1 illustrates one example of a communication system 100, various changes may be made to FIG. 1. For example, the system 100 could include any number of cell sites 102a-102c and base stations 104a-104c. Also, the system 100 could be connected to any other or additional types of external networks. In addition, FIG. 1 illustrates one example operational environment for the communication device 106. The communication device 106 could be used in any other or additional types of systems.

FIG. 2 illustrates an example communication device 106 according to one embodiment of this disclosure. In particular, FIG. 2 illustrates an example communication device 106 used in the communication system 100 of FIG. 1. Other communication devices could be used in the communication system 100 of FIG. 1 or in other systems without departing from the scope of this disclosure. Also, the communication device 106 shown in FIG. 2 has been simplified for ease of illustration and explanation.

In this example embodiment, the communication device 106 includes an antenna 202. The antenna 202 receives incoming signals for the communication device 106 and communicates outgoing signals from the communication device 106. The antenna 202 represents any suitable structure for transmitting and/or receiving signals, such as a radio frequency (RF) antenna.

The communication device 106 also includes a transceiver 204 coupled to the antenna 202. In this document, the term "couple" refers to any direct or indirect communication between two or more components, whether or not those components are in physical contact with one another. The transceiver 204 receives incoming signals through the antenna 202 and down-converts the incoming signals to produce intermediate frequency signals or baseband signals. The transceiver 204 also receives and up-converts intermediate frequency signals or baseband signals to produce outgoing signals transmitted by the antenna 202. The transceiver 204 represents any hardware, software, firmware, or combination thereof for processing incoming and/or outgoing signals, such as a RF transceiver.

Receive processing circuitry 206 is coupled to the transceiver 204. The receive processing circuitry 206 receives and processes the intermediate frequency or baseband signals associated with the incoming signals received by the transceiver 204. The receive processing circuitry 206 also produces processed baseband signals. For example, the receive processing circuitry 206 may filter and decode the intermediate frequency or baseband signals produced by the transceiver 204. The receive processing circuitry 206 provides the processed baseband signals to a speaker 208 for presentation or to a controller 214 for further processing. The receive processing circuitry 206 includes any hardware, software, firmware, or combination thereof for processing intermediate frequency or baseband signals.

Transmit processing circuitry 210 is coupled to the transceiver 204. The transmit processing circuitry 210 generates the intermediate frequency or baseband signals used by the transceiver 204 to produce the outgoing signals. For example, the transmit processing circuitry 210 may receive, digitize, and encode voice data from a microphone 212 or other outgoing baseband data from the controller 214. The transmit processing circuitry 210 includes any hardware, software, firmware, or combination thereof for generating intermediate frequency or baseband signals.

The controller 214 is coupled to the receive processing circuitry 206 and the transmit processing circuitry 210. The controller 214 performs any of a wide variety of functions in the communication device 106. For example, the controller 214 may allow a user of the communication device 106 to view web pages using a browser application, send or receive messages using an email application, or access a calendar application. The controller 214 represents any suitable processor or controller.

In one aspect of operation, the transceiver 204 includes two or more amplifiers to amplify incoming signals. The controller 214 detects when a first amplifier becomes saturated and when the signal strength of a desired signal fails to exceed a threshold. When both occur, the controller 214 dynamically increases the current supplied to the first amplifier and/or begins using a second amplifier to amplify the incoming signals. Because more power is consumed by the communication device 106 when either of these actions occurs, the increased current or second amplifier is used in limited circumstances. This helps to reduce the power consumed by the communication device 106.

Although FIG. 2 illustrates one example of a communication device 106, various changes may be made to FIG. 2. For example, other one-way or multi-way communication devices could be used in the communication system 100 of FIG. 1. Also, various components of the communication device 106 could be combined or omitted or additional components can be added according to particular needs. Further, the communication device 106 could include a receiver in place of the transceiver 204 and omit the transmit processing circuitry 210. In addition, the dynamic functionality described above could be implemented in any other suitable communication or other device.

Figure 3:
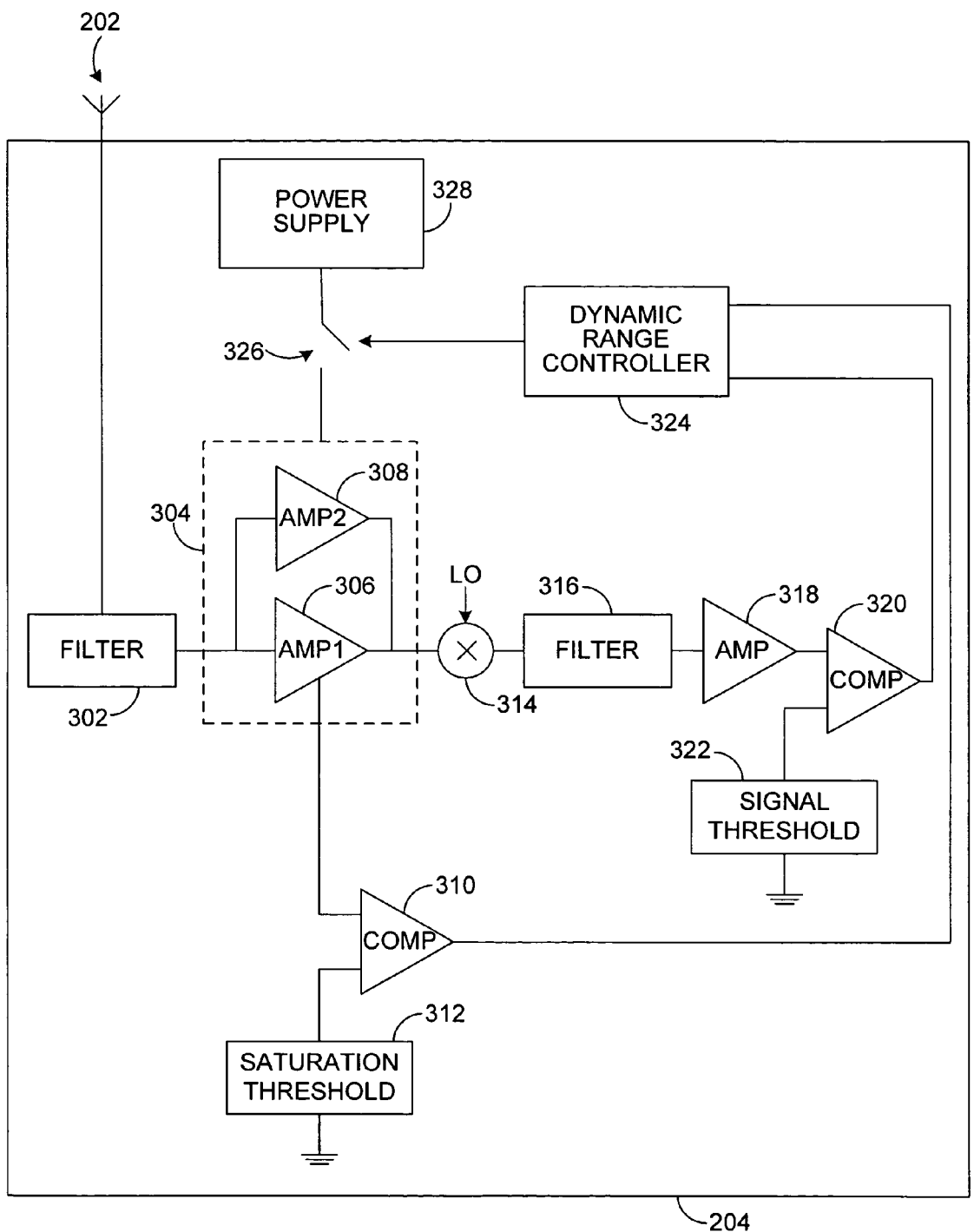
FIG. 3 illustrates a portion of an example transceiver according to one embodiment of this disclosure.

FIG. 3 illustrates a portion of an example transceiver 204 according to one embodiment of this disclosure. In particular, FIG. 3 illustrates a portion of an example transceiver 204 used in the communication device 106 of FIG. 2. Other transceivers could be used in the communication device 106 of FIG. 2 or in other devices without departing from the scope of this disclosure. Also, the transceiver 204 shown in FIG. 3 has been simplified for ease of illustration and explanation.

In the illustrated example, the transceiver 204 receives incoming signals through the antenna 202. The signals could, for example, represent radio frequency signals. A filter 302 receives and filters the incoming signals received by the antenna 202. The filter 302 could represent any suitable filter or filters, such as a low pass filter or a bandpass filter. As a particular example, the filter 302 could filter any signals not falling within a range of frequencies, where a signal of interest falls within the range of frequencies.

An amplification stage 304 is coupled to the filter 302. The amplification stage 304 receives the filtered incoming signals from the filter 302 and amplifies the filtered signals. In the illustrated example, the amplification stage 304 includes a first amplifier (AMP1) 306 and a second amplifier (AMP2) 308. In particular embodiments, the first amplifier 306 constantly amplifies the filtered signals, and the second amplifier 308 amplifies the filtered signals at selected times. Each of the amplifiers 306, 308 represents any suitable amplifier. Although FIG. 3 illustrates two amplifiers 306, 308 in the amplification stage 304, any suitable number of amplifiers may be used in the amplification stage 304.

In one aspect of operation, the operation of the transceiver 204 may be adversely affected under different operating conditions. As particular examples, the transceiver 204 may be adversely affected when the transceiver 204 receives a strong interfering signal or when the desired signal does not have a strong signal strength.

The presence of a strong interfering signal may cause the first amplifier 306 to saturate. Saturation of the first amplifier 306 may be detected using a comparator (COMP) 310. The comparator 310 compares the output of the first amplifier 306 to a threshold 312. When the output of the first amplifier 306 exceeds the threshold 312, saturation of the first amplifier 306 may have occurred. The comparator 310 then generates an output signal identifying the saturation condition.

The presence of a desired signal with a strong signal strength is detected by mixing the amplified signals produced by the amplification stage 304 at a mixer 314. The mixer 314 performs any suitable mixing operation involving the amplified signals. For example, the mixer 314 may down-convert the amplified signals using a signal from a local oscillator or other suitable source. The mixer 314 may represent any hardware, software, firmware, or combination thereof for mixing two or more signals.

The mixer 314 provides the mixed signals to another filter 316. The filter 316 filters the mixed signals, such as by limiting the frequencies of the mixed signals to a specific bandwidth. The filter 316 represents any suitable filter or filters, such as a low pass filter or a bandpass filter. The filtered signals produced by the filter 316 are amplified by an amplifier (AMP) 318. The amplifier 318 represents any suitable amplifier. The output of the amplifier 318 represents the desired signal contained in the incoming signal.

To detect when a desired signal has a strong signal strength, another comparator (COMP) 320 receives the amplified signals produced by the amplifier 318. The comparator 320 compares the voltage of the amplified signals to a threshold voltage 322 and produces an output signal based on the comparison. The output signal produced by the comparator 320 identifies when the desired signal has a signal strength above a threshold level.

In the illustrated example, the outputs of both comparators 310, 320 are provided to a dynamic range controller 324. The dynamic range controller 324 identifies when the comparator 310 detects saturation of the first amplifier 306 or when the comparator 320 detects that the desired signal has a signal strength below a threshold level. If both conditions are identified, the dynamic range controller 324 closes a switch 326. In some embodiments, the switch 326 connects the second amplifier 308 to a power supply 328. When connected to the power supply 328, the second amplifier 308 begins amplifying the incoming signals provided to the amplification stage 304 by the filter 302. In this way, the second amplifier 308 only operates and consumes power during limited circumstances (saturation of the first amplifier 306 and the signal strength of the desired signal falling below a threshold). In other embodiments, the switch 326 connects the first amplifier 306 to a power supply 328. When connected to the power supply 328, the first amplifier 306 receives more current. In this way, the first amplifier 306 only receives additional current during limited circumstances (saturation of the first amplifier 306 and the signal strength of the desired signal falling below a threshold). In still other embodiments, the switch 326 connects the first amplifier 306 and the second amplifier 308 to the power supply 328.

The dynamic range controller 324 may later determine that the additional current and/or second amplifier 308 is no longer needed. For example, the dynamic range controller 324 may wait for the signal strength of the desired signal to exceed the second threshold or wait for a specified amount of time to elapse. The dynamic range controller 324 could also allow a user to control when the second amplifier 308 is used. The dynamic range controller 324 could further open the switch 326 when the end of an incoming signal has been received. This may occur, for example, when the transceiver 204 receives a stream of packets over the incoming signal, and the dynamic range controller 324 detects the last packet in the stream.

The dynamic range controller 324 includes any hardware, software, firmware, or combination thereof that is capable of dynamically altering the way that the amplification stage 304 amplifies the incoming signals. As an example, the dynamic range controller 324 could include hardware, software, firmware, or a combination thereof that is operable to control when the second amplifier 308 is used in the transceiver 204 and/or when the current used by the first amplifier 306 is adjusted. In particular embodiments, the dynamic range controller 324 may represent a portion of the functionality of the controller 214 of FIG. 2. Also, the switch 326 represents any structure for selectively coupling the power supply 328 to the amplification stage 304.

While the transceiver 204 of FIG. 3 has been illustrated and described as using two amplifiers 306, 308 coupled in parallel to amplify a signal, the amplifiers 306, 308 could be arranged and used in any suitable manner. For example, the amplifiers 306, 308 need not be configured to amplify the incoming signal at the same time. As a particular example, when the saturation threshold 312 is exceeded and the signal threshold 322 is not exceeded, the dynamic range controller 324 could deactivate the first amplifier 306 and activate the second amplifier 308.

Although FIG. 3 illustrates one example of a transceiver 204, various changes may be made to FIG. 3. For example, any type or types of filters could be used in the transceiver 204. Also, the transceiver 204 could be used in any suitable device, such as in a mobile telephone or other wireless device. Further, a buffer could be provided in the transceiver 204 so that less information is lost when switching the second amplifier 308. In addition, the components shown in FIG. 3 could be used as at least a portion of a receiver in a communication device 106.

Figure 4:
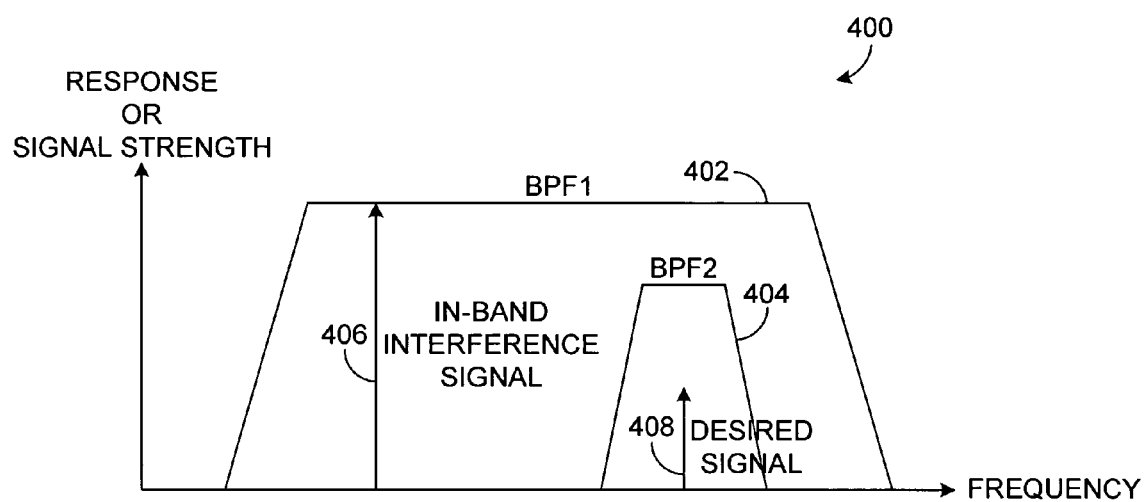
FIG. 4 illustrates an example frequency response according to one embodiment of this disclosure.

FIG. 4 illustrates an example frequency response 400 according to one embodiment of this disclosure. The frequency response 400 may, for example, be supported by the transceiver 204 shown in FIG. 3. The frequency response 400 shown in FIG. 4 is for illustration only. Other frequency responses could be used without departing from the scope of this disclosure. Also, any other transceiver or receiver could be used to produce or otherwise support the frequency response 400 shown in FIG. 4.

As shown in FIG. 4, the first filter 302 filters signals not falling within a larger bandwidth 402, and the second filter 316 filters signals not falling within a smaller bandwidth 404. This allows the transceiver 204 to identify a desired signal 406 in the incoming signals.

Because the first filter 302 has a larger bandwidth, it is possible for a strong undesired signal 406 to remain despite the filtering performed by the first filter 302. This strong undesired signal 406 could saturate the first amplifier 306 in the transceiver 204. If this signal 406 actually saturates the first amplifier 306, the comparator 310 can detect the saturation and signal the dynamic range controller 324. The dynamic range controller 324 may then take suitable action, such as by switching the additional amplifier 308 into the signal path or increasing the current supplied to the first amplifier 306. The additional amplifier 308 or the first amplifier 306 with the additional current may be able to amplify the undesired signal 406 without saturating, and the undesired signal 406 is later removed by the second filter 316.

Similarly, the strength of the desired signal 408 could adversely affect the transceiver 204. The comparator 320 can detect the low signal strength and signal the dynamic range controller 324. The dynamic range controller 324 may again take suitable action, such as by switching the additional amplifier 308 into the signal path or increasing the current supplied to the first amplifier 306.

Although FIG. 4 illustrates one example of a frequency response 400 of the transceiver 204, various changes may be made to FIG. 4. For example, the bandwidths 402, 404 are for illustration only. Any other suitable bandwidths produced by any other filters could be used.

Figure 5A:
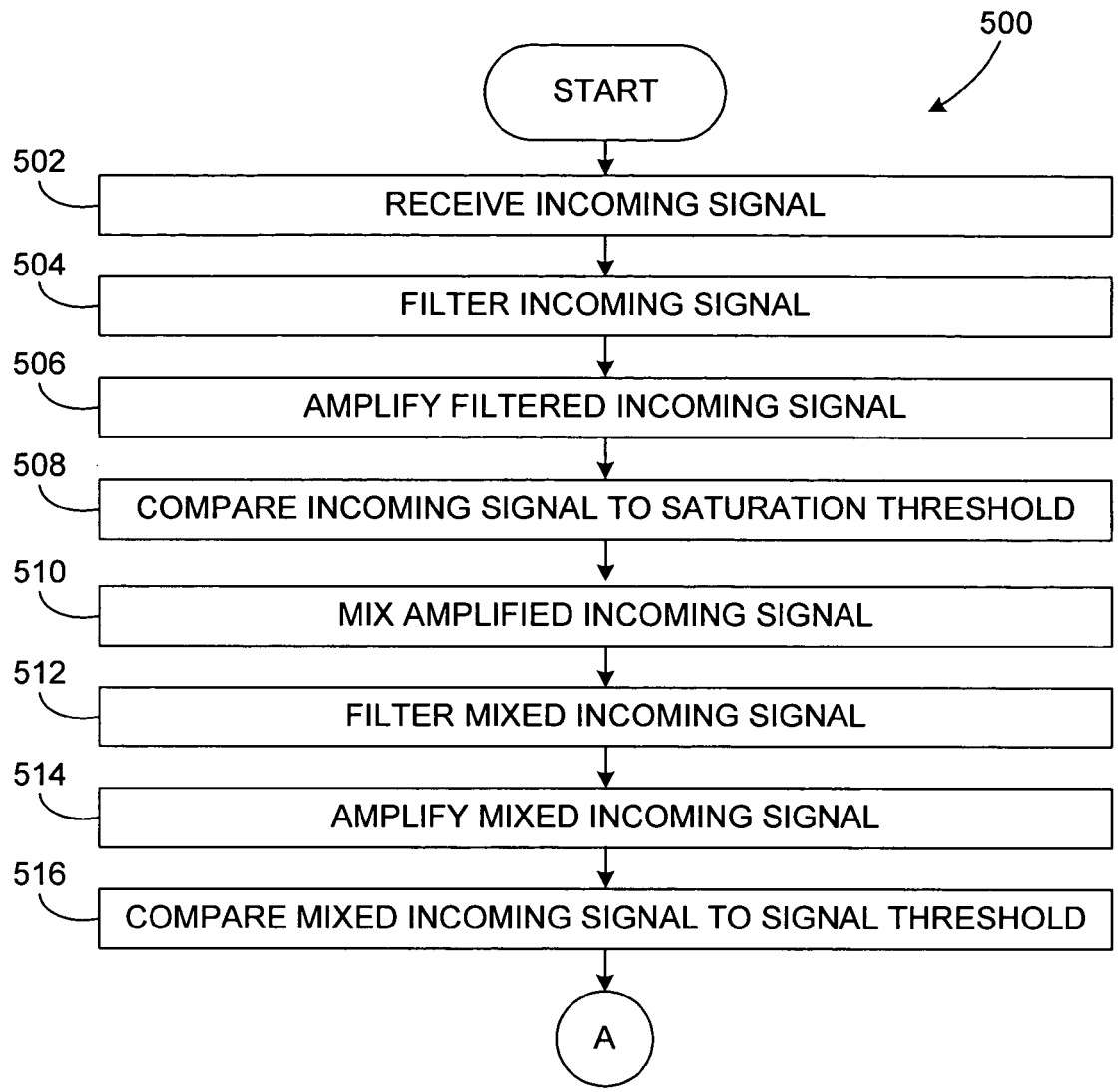
FIGS. 5A-5B illustrate an example method for dynamic range enhancement according to one embodiment of this disclosure.
Figure 5B:
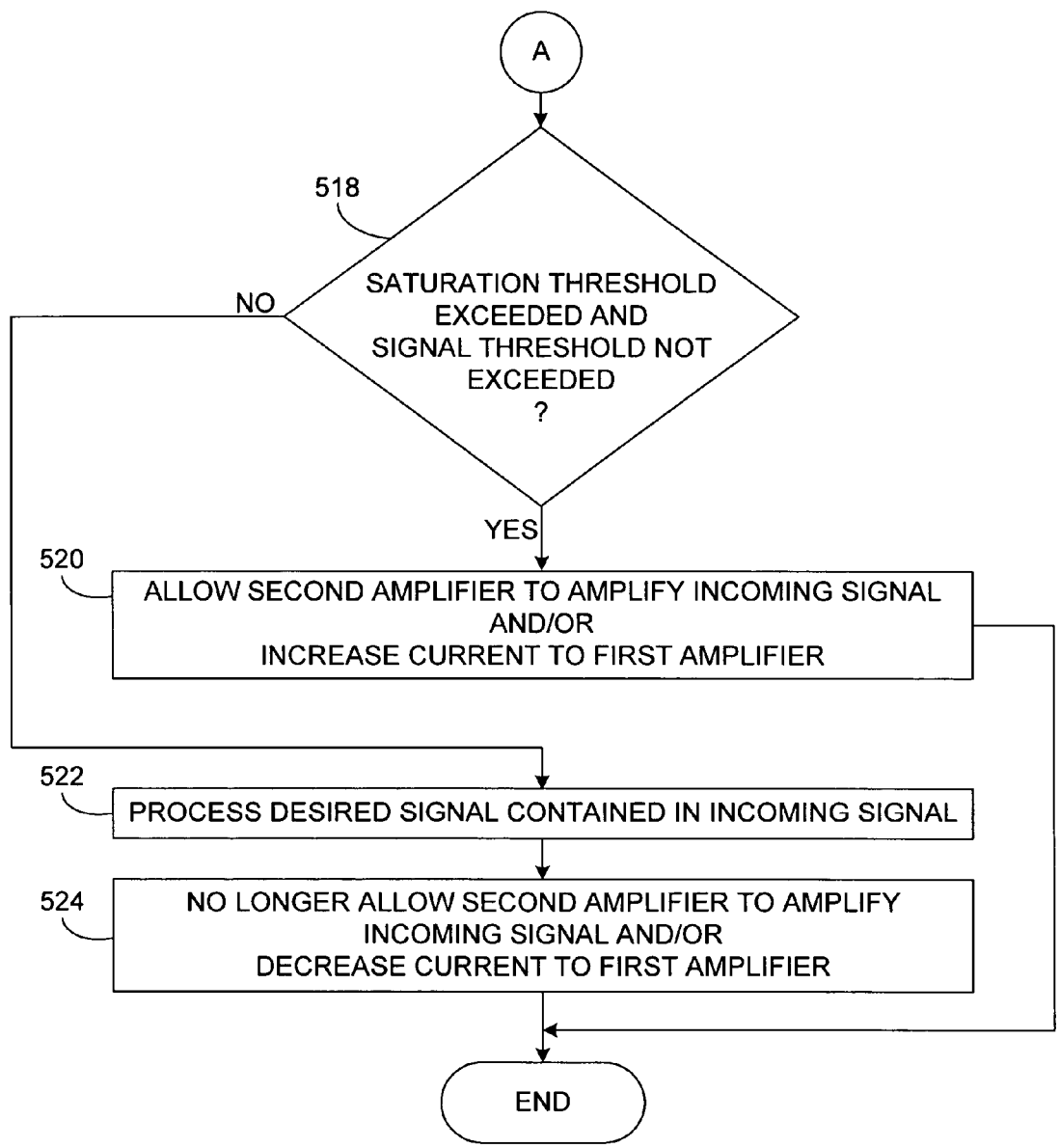

FIGS. 5A-5B illustrate an example method 500 for dynamic range enhancement according to one embodiment of this disclosure. For ease of explanation, the method 500 is described with respect to the transceiver 204 of FIG. 3 operating in the communication device 106 of FIG. 2. The method 500 could be used by any other suitable transceiver or receiver and in any other suitable device.

The communication device 106 receives an incoming signal at step 502. This may include, for example, the antenna 202 receiving an incoming signal, such as an RF signal, from the base stations 104a-104c. This may also include the transceiver 204 receiving the incoming signal from the antenna 202.

The communication device 106 filters the incoming signal at step 504. This may include, for example, the filter 302 receiving and filtering the incoming signal to produce a filtered incoming signal. This may also include the filter 302 low-pass filtering or bandpass filtering the incoming signal.

The communication device 106 amplifies the filtered incoming signal at step 506. This may include, for example, the first amplifier 306 receiving and amplifying the incoming signal to produce an amplified incoming signal.

The communication device 106 compares the amplified incoming signal to a first threshold at step 508. This may include, for example, the comparator 310 comparing the amplified incoming signal to a saturation threshold 312.

The communication device 106 mixes the amplified incoming signal at step 510. This may include, for example, the mixer 314 mixing the amplified incoming signal with a local oscillator signal or other signal to produce a mixed incoming signal.

The communication device 106 filters the mixed incoming signal at step 512. This may include, for example, the filter 316 receiving and filtering the mixed incoming signal to produce a filtered mixed incoming signal. This may also include the filter 316 low-pass filtering or bandpass filtering the mixed incoming signal.

The communication device 106 amplifies the filtered mixed incoming signal at step 514. This may include, for example, the amplifier 318 receiving and amplifying the filtered mixed incoming signal to produce an amplified mixed incoming signal. The amplified mixed incoming signal may represent a desired signal contained in the original incoming signal.

The communication device 106 compares the amplified mixed incoming signal or desired signal to a second threshold at step 516. This may include, for example, the comparator 322 comparing the amplified mixed incoming signal to a signal threshold 322.

The communication device 106 determines whether the amplified incoming signal exceeded the first threshold and the amplified mixed incoming signal or desired signal exceeded the second threshold at step 518. This may include, for example, the dynamic range controller 324 determining whether the comparator 310 identified a saturation condition and whether the comparator 320 identified a low signal strength condition.

If the first threshold is exceeded at step 508 and the second threshold is not exceeded at step 516, the communication device 106 allows the second amplifier 308 to amplify the incoming signal and/or increases the current provided to the first amplifier 306 at step 520. This may include, for example, the dynamic range controller 324 closing the switch 326 to couple the power supply 328 to the first amplifier 306 and/or second amplifier 308.

If either condition is not met, the communication device 106 processes or otherwise uses the desired signal at step 522. This may include, for example, the receive processing circuitry 206 in the communication device 106 processing the desired signal.

The communication device 106 also no longer allows the second amplifier 308 to amplify the incoming signal and/or decreases the current provided to the first amplifier 306 at step 524. This may include, for example, the controller 324 opening the switch 326 to decouple the power supply 328 from the first amplifier 306 and/or second amplifier 308.

At this point, the method 500 ends. The communication device 106 then takes any suitable action, such as by repeating the method 500.

Although FIGS. 5A-5B illustrate one example of a method 500 for dynamic range enhancement, various changes may be made to FIGS. 5A-5B. For example, the communication device 106 could omit one or more of the filtering and/or amplifying steps. Also, FIGS. 5A-5B illustrate that the controller 324 stops using the second amplifier 308 and/or decreases the current when both threshold conditions are met. In other embodiments, the controller 324 could stop using the second amplifier 308 and/or decrease the current in response to other conditions, such as a predetermined amount of time elapsing.

It may be advantageous to set forth definitions of certain words and phrases that have been used within this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, software, firmware, or combination thereof. It should be noted that the functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A circuit, comprising:
one or more first amplifiers operable to amplify an incoming signal to produce an amplified incoming signal, the incoming signal associated with a desired signal; and
a controller operable, in response to the amplified incoming signal exceeding a first threshold and the desired signal not exceeding a second threshold, to at least one of:
allow one or more second amplifiers to amplify the incoming signal; and
increase a current supplied to the one or more first amplifiers.

2. The circuit of claim 1, further comprising:
a first comparator operable to compare the amplified incoming signal to the first threshold; and
a second comparator operable to compare the desired signal to the second threshold.

3. The circuit of claim 1, further comprising a filter operable to filter the incoming signal to produce a filtered incoming signal; and
wherein the one or more first amplifiers are operable to amplify the filtered incoming signal to produce the amplified incoming signal.

4. The circuit of claim 1, further comprising:
a mixer operable to perform a mixing operation involving the amplified incoming signal to produce a mixed incoming signal;
a filter operable to filter the mixed incoming signal to produce a filtered mixed incoming signal; and
a third amplifier operable to amplify the filtered mixed incoming signal to produce the desired signal.

5. The circuit of claim 4, wherein the filter comprises a bandpass filter.

6. The circuit of claim 1, further comprising a switch capable of coupling a power supply to at least one of the one or more first amplifiers and the one or more second amplifiers, the controller operable to open and close the switch.

7. A system, comprising:
an antenna operable to receive an incoming signal; and
a receiver comprising:
one or more first amplifiers operable to amplify the incoming signal to produce an amplified incoming signal, the incoming signal associated with a desired signal; and
a controller operable, in response to the amplified incoming signal exceeding a first threshold and the desired signal not exceeding a second threshold, to at least one of:
allow one or more second amplifiers to amplify the incoming signal; and
increase a current supplied to the one or more first amplifiers.

8. The system of claim 7, further comprising:
a first comparator operable to compare the amplified incoming signal to the first threshold; and
a second comparator operable to compare the desired signal to the second threshold.

9. The system of claim 7, further comprising:
a first filter operable to filter the incoming signal to produce a filtered incoming signal, wherein the one or more first amplifiers are operable to amplify the filtered incoming signal to produce the amplified incoming signal;
a mixer operable to perform a mixing operation involving the amplified incoming signal to produce a mixed incoming signal;
a second filter operable to filter the mixed incoming signal to produce a filtered mixed incoming signal; and
a third amplifier operable to amplify the filtered mixed incoming signal to produce the desired signal.

10. The system of claim 7, further comprising a switch capable of coupling a power supply to at least one of the one or more first amplifiers and the one or more second amplifiers, the controller operable to open and close the switch.

11. The system of claim 7, further comprising receive processing circuitry operable to process the desired signal.

12. The system of claim 7, wherein the receiver comprises a portion of a transceiver.

13. The system of claim 12, further comprising transmit processing circuitry operable to generate an outgoing signal for transmission by the transceiver.

14. The system of claim 7, wherein the antenna and receiver comprise at least a portion of one of: a mobile telephone, a computing device, and a personal digital assistant.

15. A method, comprising:
amplifying an incoming signal using one or more first amplifiers to produce an amplified incoming signal, the incoming signal associated with a desired signal;
determining whether the amplified incoming signal exceeds a first threshold and the desired signal does not exceed a second threshold; and
in response to determining that the first threshold is exceeded and the second threshold is not exceeded, at least one of:
allowing one or more second amplifiers to amplify the incoming signal; and
increasing a current supplied to the one or more first amplifiers.

16. The method of claim 15, further comprising filtering the incoming signal to produce a filtered incoming signal; and wherein amplifying the incoming signal comprises amplifying the filtered incoming signal to produce the amplified incoming signal.

17. The method of claim 15, further comprising:

mixing the amplified incoming signal and a local oscillator signal to produce a mixed incoming signal;

filtering the mixed incoming signal to produce a filtered mixed incoming signal; and amplifying the filtered mixed incoming signal to produce the desired signal.

18. The method of claim 15, wherein at least one of allowing the one or more second amplifiers to amplify the incoming signal and increasing the current supplied to the one or more first amplifiers comprises closing a switch, the switch capable of coupling a power supply to at least one of the one or more first amplifiers and the one or more second amplifiers.

19. The method of claim 18, further comprising:

determining whether at least one of: the amplified incoming signal no longer exceeds the first threshold and the desired signal exceeds the second threshold; and in response to determining that the amplified incoming signal no longer exceeds the first threshold or the desired signal exceeds the second threshold, at least one of:

no longer allowing the one or more second amplifiers to amplify the incoming signal; and decreasing the current supplied to the one or more first amplifiers.

20. The method of claim 19, wherein no longer allowing the one or more second amplifiers to amplify the incoming signal and decreasing the current supplied to the one or more first amplifiers comprises opening the switch.

21. The circuit of claim 1, wherein the controller is operable, in response to the amplified incoming signal exceeding the first threshold and the desired signal not exceeding the second threshold, to allow the one or more second amplifiers to amplify the incoming signal.

22. The circuit of claim 1, wherein the controller is operable, in response to the amplified incoming signal exceeding the first threshold and the desired signal not exceeding the second threshold, to increase the current supplied to the one or more first amplifiers.

23. The system of claim 7, wherein the controller is operable, in response to the amplified incoming signal exceeding the first threshold and the desired signal not exceeding the second threshold, to allow the one or more second amplifiers to amplify the incoming signal.

24. The system of claim 7, wherein the controller is operable, in response to the amplified incoming signal exceeding the first threshold and the desired signal not exceeding the second threshold, to increase the current supplied to the one or more first amplifiers.

25. The method of claim 15, wherein the method comprises, in response to determining that the first threshold is exceeded and the second threshold is not exceeded, allowing the one or more second amplifiers to amplify the incoming signal.

26. The method of claim 15, wherein the method comprises, in response to determining that the first threshold is exceeded and the second threshold is not exceeded, increasing the current supplied to the one or more first amplifiers.

* * * * *